United States Patent
Shibuya et al.

(10) Patent No.: US 9,458,535 B2
(45) Date of Patent: Oct. 4, 2016

(54) SEMICONDUCTOR MANUFACTURING DEVICE AND SEMICONDUCTOR MANUFACTURING METHOD

(71) Applicant: Kabushiki Kaisha Toshiba, Minato-ku (JP)

(72) Inventors: Katsunori Shibuya, Mie (JP); Takashi Imoto, Kamakura (JP); Soichi Homma, Tokkaichi (JP); Takeshi Watanabe, Yokkaichi (JP); Yuusuke Takano, Yokkaichi (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 8 days.

(21) Appl. No.: 14/482,075

(22) Filed: Sep. 10, 2014

(65) Prior Publication Data

US 2015/0167156 A1 Jun. 18, 2015

(30) Foreign Application Priority Data

Dec. 13, 2013 (JP) .................................. 2013-257783

(51) Int. Cl.
| | |
|---|---|
| *G01R 31/20* | (2006.01) |
| *C23C 14/50* | (2006.01) |
| *C23C 14/54* | (2006.01) |
| *H01L 23/552* | (2006.01) |
| *C23C 14/56* | (2006.01) |
| *H01L 21/677* | (2006.01) |

(52) U.S. Cl.
CPC ............... *C23C 14/50* (2013.01); *C23C 14/54* (2013.01); *C23C 14/56* (2013.01); *H01L 21/67778* (2013.01); *H01L 23/552* (2013.01); *H01L 2924/0002* (2013.01)

(58) Field of Classification Search
CPC .. B22F 9/16; H01L 23/552; H01L 21/67265; H01L 21/67778; H01L 2924/14; G01R 31/2851; G01R 31/2887; G01R 31/307; Y10T 29/49146; C23C 26/02; C23C 14/50; C23C 14/54; C23C 26/00; C23C 14/34; H05K 1/0219
See application file for complete search history.

(56) References Cited

U.S. PATENT DOCUMENTS

| | | | |
|---|---|---|---|
| 2012/0015687 A1 | 1/2012 | Yamada et al. | |
| 2015/0382522 A1* | 12/2015 | Yamamoto | H05K 13/0413 29/834 |

FOREIGN PATENT DOCUMENTS

| | | |
|---|---|---|
| CN | 101415630 A | 4/2009 |
| JP | 2001-226769 | 8/2001 |

(Continued)

OTHER PUBLICATIONS

Office Action mailed Feb. 15, 2016 in Taiwanese Patent Application No. 103143372 (with English Translation).

*Primary Examiner* — Minh N Tang
(74) *Attorney, Agent, or Firm* — Oblon, McClelland, Maier & Neustadt, L.L.P

(57) ABSTRACT

A semiconductor manufacturing device has a conveyor configured to convey a tray having an unshielded semiconductor device mounted thereon to go through electromagnetic shielding, and a controller configured to control the conveyor. The controller performs control to take out the tray from a tray supply storage storing trays each having an unshielded semiconductor device mounted thereon to go through the electromagnetic shielding, place the tray on a carrier, and convey this carrier to a sputtering device which coats the unshielded semiconductor device with a sputtering material for the electromagnetic shielding, and the controller performs control to take out, from the sputtering device, the carrier having the tray placed thereon with an electromagnetically shielded semiconductor device being mounted on the tray, convey the tray, pick up the tray having the electromagnetically shielded semiconductor device mounted thereon from the carrier, and store the tray in the tray supply storage.

18 Claims, 7 Drawing Sheets

(56) References Cited

FOREIGN PATENT DOCUMENTS

| | | |
|---|---|---|
| JP | 2006-118008 | 5/2006 |
| JP | 2009-167519 | 7/2009 |
| JP | 2012-39104 | 2/2012 |
| JP | 2013-241633 | 12/2013 |
| TW | 201346050 A | 11/2013 |
| WO | WO 2006/043343 A1 | 4/2006 |

* cited by examiner

SEMICONDUCTOR MANUFACTURING DEVICE AND SEMICONDUCTOR MANUFACTURING METHOD

CROSS REFERENCE TO RELATED APPLICATIONS

This application is based upon and claims the benefit of priority from the prior Japanese Patent Application No. 2013-257783, filed on Dec. 13, 2013, the entire contents of which are incorporated herein by reference.

FIELD

Embodiments of the present invention relate to a semiconductor manufacturing device and a semiconductor manufacturing method for electromagnetically shielding a semiconductor package.

BACKGROUND

Semiconductor devices used in a mobile communication tool such as cellular phone, smartphone, etc. are required to restrain unnecessary electromagnetic waves from leaking to the outside as much as possible, not to exert a negative influence on communication properties. Accordingly, a semiconductor package having an electromagnetic shielding function has been proposed.

For example, electromagnetic shielding of the semiconductor package is performed by covering the surface of a package made of resin with a metal film for electromagnetic shielding, to make this metal film electrically contact with the ground layer of a semiconductor chip in the semiconductor package.

The process of covering the surface of resin with a metal film can be performed by using a sputtering device used in a preceding step in the semiconductor manufacturing process. The sputtering device can simultaneously form uniform metal films for a plurality of semiconductor packages. Therefore, work efficiency can be improved if many semiconductor packages which completed a packaging process are placed on a carrier, conveyed to a sputtering device, and taken into a sputtering vacuum chamber together with the carrier to go through sputtering treatment.

However, the metal sputtered in the sputtering device adheres not only to the top and side surfaces of each semiconductor package but also to the surface of the carrier. Since the dirt on the carrier increases, the carrier must be cleaned frequently, which increases maintenance cost.

DETAILED DESCRIPTION

Figure 1:
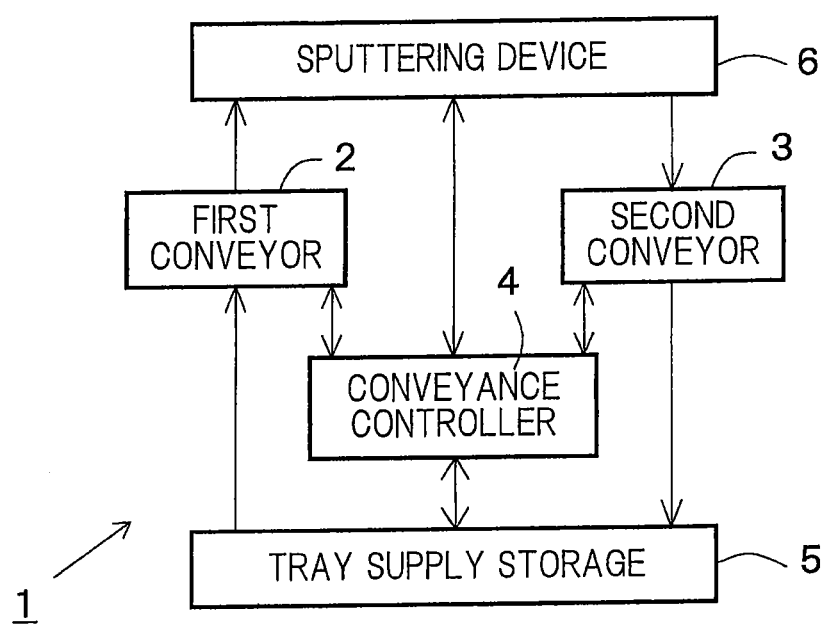
FIG. 1 is a block diagram showing a schematic structure of a semiconductor manufacturing device 1 according to a first embodiment of the present invention.

According to one embodiment, a semiconductor manufacturing device has:

a conveyor configured to convey a tray having unshielded semiconductor devices mounted thereon to go through electromagnetic shielding; and a controller configured to control the conveyor, wherein the controller performs control to take out the tray from a tray supply storage storing trays each having unshielded semiconductor devices mounted thereon to go through the electromagnetic shielding, place the tray on a carrier, and convey this carrier to a sputtering device which coats the unshielded semiconductor devices with a sputtering material for the electromagnetic shielding, and the controller performs control to take out, from the sputtering device, the carrier having the tray placed thereon with electromagnetically shielded semiconductor devices being mounted on the tray, convey the tray, pick up the tray having the electromagnetically shielded semiconductor devices mounted thereon from the carrier, and store the tray in the tray supply storage.

Hereinafter, embodiments of the present invention will be explained referring to the drawings. The upper/lower direction in the following embodiments shows a relative direction when the face on which semiconductor chips are provided is defined as the upper side, and thus may be different from the actual upper/lower direction depending on gravitational acceleration.

First Embodiment

FIG. 1 is a block diagram showing a schematic structure of a semiconductor manufacturing device 1 according to a first embodiment of the present invention. The semiconductor manufacturing device 1 of FIG. 1 has a first conveyor 2, a second conveyor 3, and a conveyance controller 4. Each of the first conveyor 2 and second conveyor 3 corresponds to a conveyor.

The first conveyor 2 takes out a tray from a tray supply storage 5 storing trays each having unshielded IC packages (semiconductor device) mounted thereon to go through electromagnetic shielding, and places the tray on a carrier. Further, the first conveyor 2 conveys this carrier to a sputtering device 6 for coating the unshielded IC packages with a sputtering material for the electromagnetic shielding.

The second conveyor 3 takes out, from the sputtering device 6, the carrier having the tray placed thereon with electromagnetically shielded IC packages being mounted on the tray. Further, the second conveyor 3 picks up this tray from the carrier, and stores it in the tray supply storage 5.

The tray supply storage 5 stores trays for storing unshielded IC packages (hereinafter referred to as unshielded trays) and trays for storing shielded IC packages (hereinafter referred to as shielded trays), each being stacked vertically. The first conveyor 2 takes out the vertically stacked unshielded trays one by one, and places each tray on the carrier. The second conveyor 3 keeps the shielded tray mounted on the carrier, on the shielded trays vertically stacked. In the example shown FIG. 1, the tray supply storage 5 has a tray cassette for storing vertically stacked unshielded trays and a tray cassette for storing vertically stacked shielded trays. Note that a plurality of trays 17 may be stacked vertically without using such a tray cassette.

Each of the trays has the same size, and has a plurality of recesses for storing IC packages respectively. A wall which is half the height of the IC packages is provided between adjacent two recesses, so that the top and side surfaces of all of the IC packages in the tray are coated with the sputtering material when the tray is taken into the sputtering device 6 with the IC packages being mounted thereon.

In the present embodiment, as many trays as possible are placed on the carrier to reduce the area where the top surface of the carrier is exposed, in order to prevent the sputtering material of the sputtering device 6 from adhering to the top surface of the carrier as much as possible. Therefore, each of the first conveyor 2 and second conveyor 3 conveys the carrier having a plurality of trays placed thereon, the number of trays being determined depending on the size of the carrier and the size of each tray.

The conveyance controller 4 controls the conveyance of the first conveyor 2 and second conveyor 3. More concretely, the conveyance controller 4 manages and controls the current position of the carrier, the number of trays on the carrier, the progress of sputtering treatment, etc.

Figure 2:
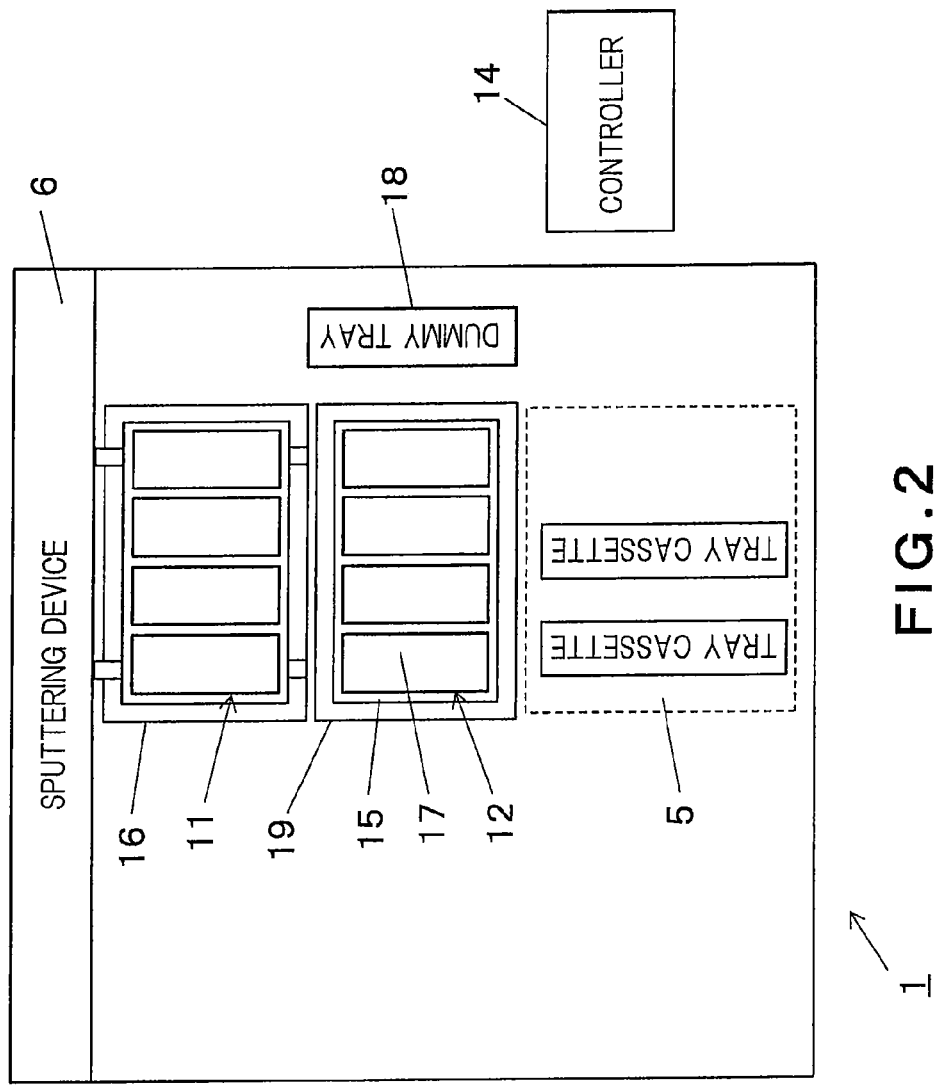
FIG. 2 is a schematic diagram showing a more concrete example of the semiconductor manufacturing device 1 of FIG. 1.

FIG. 2 is a schematic diagram showing a more concrete example of the semiconductor manufacturing device 1 of FIG. 1. The semiconductor manufacturing device 1 of FIG. 2 has a first handler 11, a second handler 12, and a controller 14.

The second handler 12 takes out a tray 17 from the tray supply storage 5. The first handler 11 passes, to the sputtering device 6, a carrier 15 with the tray 17 being mounted thereon. Further, the first handler 11 places the carrier 15 carried out from the sputtering device 6 on a first conveying table 19 of the second handler 12.

The second handler 12 takes out an unshielded tray 17 from the tray supply storage 5, and places it on the carrier 15. Further, the second handler 12 picks up a shielded tray 17 from the carrier 15, and stores it in the tray supply storage 5.

The controller 14, which is provided to control the first handler 11 and second handler 12, corresponds to the conveyance controller 4 of FIG. 1. The controller 14 can be realized by using a personal computer or a workstation, for example.

The first conveyor 2 of FIG. 1 places the unshielded trays 17 on the carrier 15 by using the second handler 12, and conveys the carrier 15 to the sputtering device 6. The second conveyor 3 receives, from the sputtering device 6, the carrier 15 having the shielded trays 17 placed thereon by using the first handler 11, and conveys the carrier 15 to store the shielded trays 17 in the tray supply storage 5 by using the second handler 12.

In the example of FIG. 2, four trays 17 are placed on the top surface of the carrier 15. The longitudinal length of the tray 17 is nearly the same as the lateral length of the carrier 15, and the lateral length of the tray 17 is approximately ¼ of the longitudinal length of the carrier 15. Thus, four trays 17 arranged along the longitudinal direction of the carrier 15 can cover nearly the entire top surface of the carrier 15, which means that the top surface of the carrier 15 is hardly exposed. When the first handler 11 passes the carrier 15 in this state to the sputtering device 6, the sputtering material hardly adheres to the top surface of the carrier 15 in the sputtering treatment performed by the sputtering device 6. In this way, dirt adhering to the top surface of the carrier 15 in the sputtering treatment can be restrained, which makes it possible to lengthen the time interval for cleaning the carrier 15.

It is assumed that the sputtering treatment is performed on a plurality of trays 17 as a lot. However, there may be a case where the top surface of the carrier 15 is partially covered with the tray(s) 17, depending on the number of remaining trays 17. This leads to the increase in the dirt on the carrier 15. To prevent this situation, a dummy tray 18 having the same shape and size as the tray 17 is previously prepared. When the unshielded tray 17 can be arranged only on a part of the top surface of the carrier 15, it is desirable to place the dummy trays 18 in empty regions. This makes it possible to equalize the level of dirt on the carrier 15, regardless of the number of trays 17 to go through the sputtering treatment.

Note that the shape and size of the tray 17 may be arbitrarily set. It is desirable to optimize the shape and size of the tray 17 in conformity with the shape and size of the carrier 15, to arrange the trays 17 so as not to expose the top surface of the carrier 15 as much as possible. Therefore, the number of trays 17 to be placed on the top surface of the carrier 15 also may be arbitrarily set. It is desirable to place an optimum number of trays 17 on the carrier 15 considering the shape and size of the carrier 15 and the shape and size of each tray 17, so as not to expose the top surface of the carrier 15 as much as possible.

Further, there is no particular limitation on the number of IC packages which can be mounted on one tray 17. The number of IC packages should be arbitrarily set considering the shape and size of the tray 17 and the shape and size of each IC package.

Figure 3:
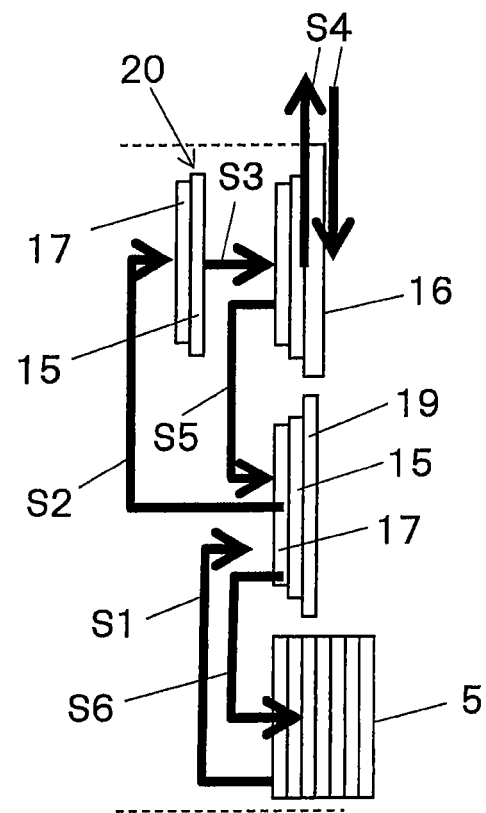
FIG. 3 is a diagram explaining the conveyance operation performed by the semiconductor manufacturing device 1 of FIG. 2.
Figure 4:
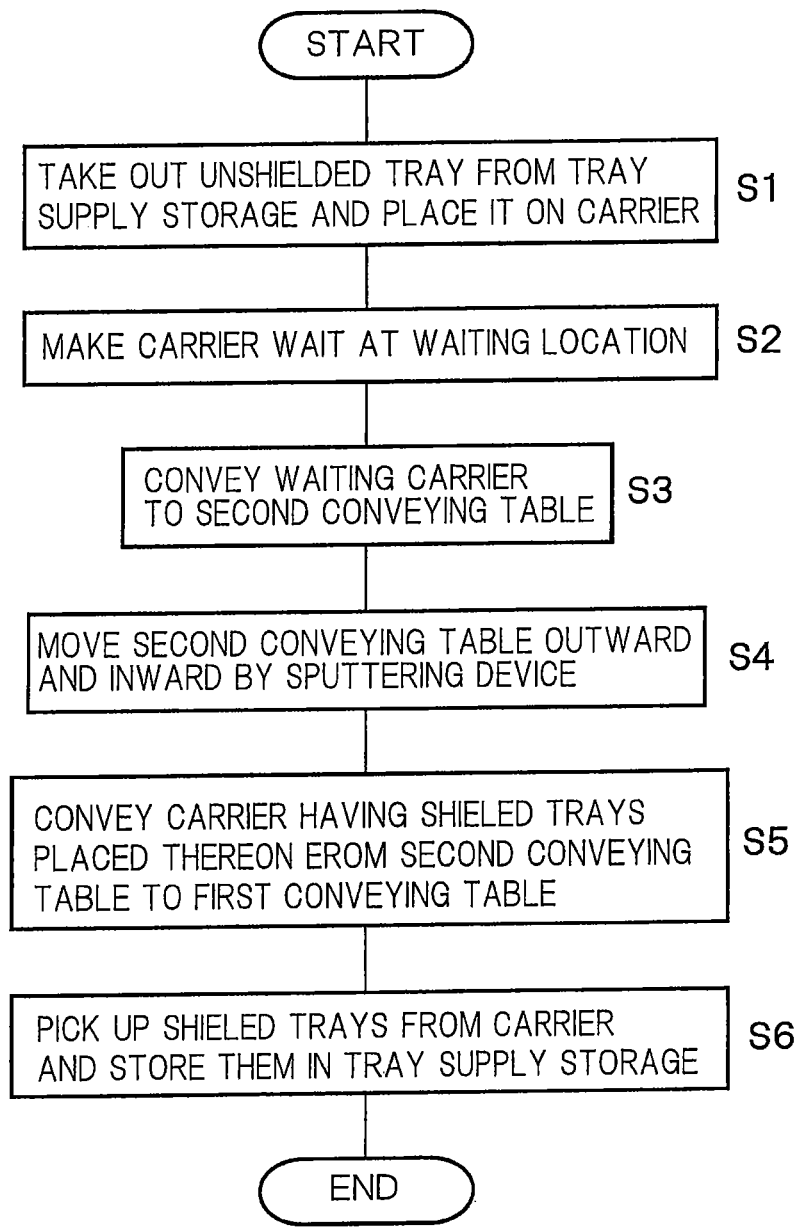
FIG. 4 is a process flow diagram corresponding to FIG. 3.

FIG. 3 is a diagram explaining the conveyance operation performed by the semiconductor manufacturing device 1 of FIG. 2, when FIG. 2 is viewed from a lateral side. Further, FIG. 4 is a process flow diagram corresponding to FIG. 3. First, the second handler 12 takes out the tray 17 having unshielded IC packages mounted thereon from the tray supply storage 5, and places it on the carrier 15 (Step S1). The second handler 12 grasps both of the longitudinal ends of the tray 17 with tray conveying arms (not shown), and places the tray 17 on the carrier 15. As stated above, since four trays 17 can be placed on the carrier 15 for example, Step S1 is repeated four times. Note that the carrier 15 is previously placed on the first conveying table 19 before starting Step S1.

The second handler 12 places the dummy tray 18 on the carrier 15 as needed. When the dummy tray 18 is placed at a location different from the tray supply storage 5, the second handler 12 moves the tray conveying arms in the two-dimensional direction, to place a desired tray 17 or dummy tray 18 on the carrier 15.

Next, the second handler 12 moves the first conveying table 19 from near the tray supply storage 5 toward the sputtering device 6 by a predetermined distance. Thus, the carrier 15 having the tray 17 thereon with unshielded IC packages being mounted on the tray 17 is conveyed together with the first conveying table 19 by a predetermined distance. The second handler 12 moves the first conveying table 19 utilizing the driving force of a servo motor, for example. How to drive the first conveying table 19 and a second conveying table 16 is not particularly questioned.

Next, the first handler 11 lifts the carrier 15, and makes the carrier 15 wait at a predetermined waiting location 20 until it can be stored in the sputtering device 6 (Step S2). The first handler 11 grasps both of the lateral ends of the carrier 15 with carrier conveying arms (not shown), and lifts the carrier 15 to the waiting location 20. The reason why the carrier 15 is made to wait at the waiting location 20 is that the carrier 15 cannot be conveyed into the sputtering device 6 until the sputtering treatment for the carrier 15 previously conveyed into the sputtering device 6 is completed. Therefore, when the sputtering device 6 is not performing the sputtering treatment, the above Step S2 can be omitted.

When a shielded carrier 15 is carried out from the sputtering device 6 and another carrier 15 is ready to be stored in the sputtering device 6, the first handler 11 conveys the carrier 15 waiting at the waiting location 20 to the second conveying table 16 for the sputtering device 6 (Step S3). Also in this case, the first handler 11 grasps both of the lateral ends of the carrier with the carrier conveying arms, and places the carrier on the second conveying table 16. The second conveying table 16 is included in the sputtering device 6, and the carrier 15 placed on the second conveying table 16 is carried into a sputtering vacuum chamber of the sputtering device 6 (Step S4). More specifically, after placing the carrier 15 on the second conveying table 16 with the carrier conveying arms, the first handler 11 transmits, to the sputtering device 6, a signal informing that the carrier 15 has been placed on the second conveying table 16. Upon receiving this signal, the sputtering device 6 draws the second conveying table 16 into the sputtering vacuum chamber to start the sputtering treatment.

When the sputtering treatment is completed, the second conveying table 16 is carried out from the sputtering vacuum chamber (Step S4), and the first handler 11 grasps the carrier 15 with the carrier conveying arms to convey it from the second conveying table 16 to the first conveying table 19 (Step S5). More specifically, when the second conveying table 16 is carried out from the sputtering device 6, the sputtering device 6 transmits a signal for informing about the carry-out. Upon receiving this signal, the first handler 11 grasps the carrier 15 with the carriers conveying arms and conveys it to the first conveying table 19.

Note that the carrier conveying arms which lift the carrier 15 having the unshielded trays 17 placed thereon from the first conveying table 19 and take it down to the second conveying table 16 through the waiting location 20 are provided separately from the carrier conveying arms which convey the carrier 15 having the shielded trays 17 placed thereon from the second conveying table 16 to the first conveying table 19. Thus, the carrier 15 having the shielded trays 17 placed thereon can be conveyed from the second conveying table 16 to the first conveying table 19 while another carrier 15 is waiting at the waiting location 20, which improves work efficiency.

After that, the second handler 12 moves the first conveying table 19 toward the tray supply storage 5 by a predetermined distance. Thus, the carrier 15 storing the electromagnetically shielded trays 17 moves together with the first conveying table 19 by a predetermined distance.

Next, the second handler 12 sequentially lifts the trays 17 each being placed on the carrier 15 on the first conveying table 19 with the tray conveying arms, and stores the trays 17 in the tray supply storage 5 (Step S6). This Step S6 is repeated until all of the trays 17 on the carrier 15 are stored in the tray supply storage 5.

In order to improve throughput, the sputtering treatment is repeatedly performed. For example, e.g. three carriers 15 are stored in the sputtering device 6 so that the carriers 15 which went through the sputtering treatment are taken out from the sputtering device 6 one by one while storing new carriers 15 in the sputtering device 6 one by one. More specifically, at the same time, the carrier 15 is placed at the waiting location 20 of the first handler 11 with another carrier 15 being placed on the first conveying table 19. This makes it possible to continuously perform electromagnetic shielding on the IC packages mounted on each tray 17 on the carrier 15 through an assembly-line operation.

As stated above, in the first embodiment, so as not to expose the top surface of the carrier 15 as much as possible, as many trays 17 as possible are placed on the top surface of the carrier 15 when performing the sputtering treatment to electromagnetically shield the IC packages on each tray 17. In this way, dirt adhering to the carrier 15 in the sputtering treatment can be restrained. Since the time interval for cleaning the carrier 15 can be lengthened, the carrier 15 can be circulated and used, which improves work efficiency and maintenance efficiency.

Second Embodiment

In the first embodiment, after the second conveyor 3 picks up the shielded trays 17 from the carrier 15 and stores them in the tray supply storage 5, the same carrier 15 is continuously used to convey other unshielded trays 17. A second embodiment to be explained below is characterized in sequentially switching a plurality of carriers 15 to be used.

Figure 5:
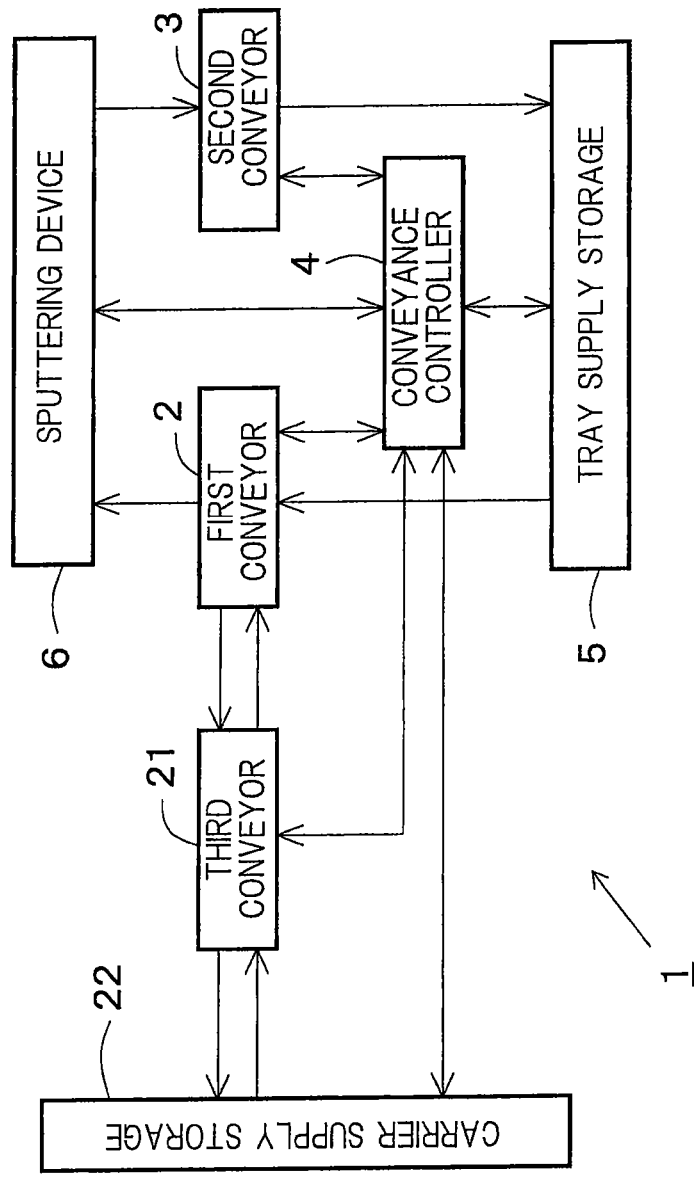
FIG. 5 is a block diagram showing a schematic structure of the semiconductor manufacturing device 1 according to a second embodiment of the present invention.

FIG. 5 is a block diagram showing a schematic structure of the semiconductor manufacturing device 1 according to the second embodiment of the present invention. The semiconductor manufacturing device 1 of FIG. 5 has a third conveyor 21 in addition to the components of FIG. 1.

After the second conveyor 3 picks up the trays 17 from the carrier 15, the third conveyor 21 conveys this carrier 15 to a carrier supply storage 22 to store this carrier 15 in the carrier supply storage 22. Further, the third conveyor 21 takes out, from the carrier supply storage 22, a carrier 15 different from the carrier 15 which has been stored in the carrier supply storage 22, and conveys the carrier 15 to the first conveyor 2.

In the first embodiment, one carrier 15 is repeatedly used when performing the sputtering treatment to electromagnetically shield the unshielded IC packages on each tray 17. On the other hand, in the second embodiment, the carrier 15 went through the sputtering treatment is conveyed to the carrier supply storage 22 and temporarily stored therein, and another carrier 15 is taken out from the carrier supply storage 22 to perform the sputtering treatment using it. Accordingly, use frequency of one carrier 15 can be reduced, which makes it possible to further lengthen the interval for cleaning the carrier 15 compared to the first embodiment.

Figure 6:
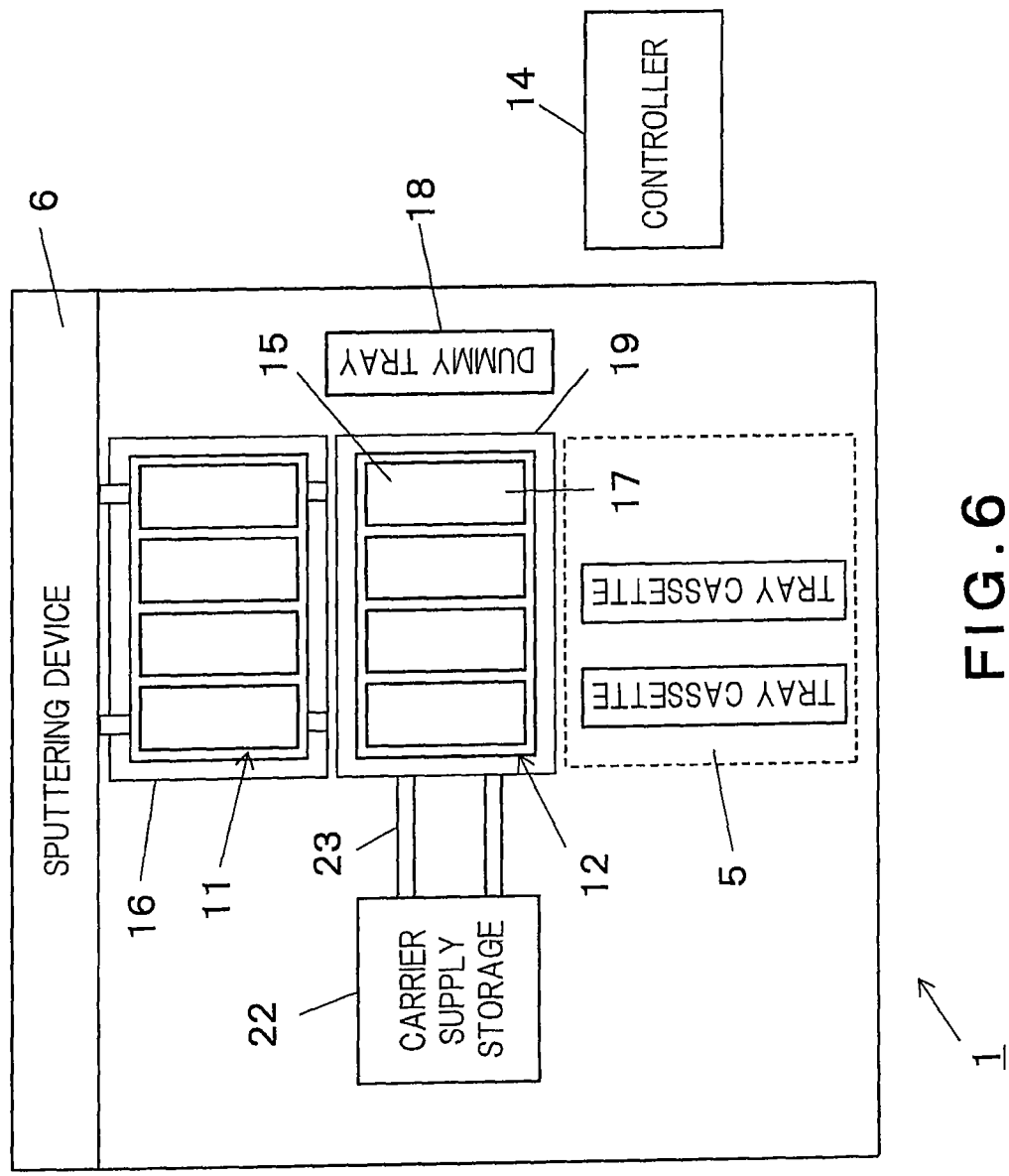
FIG. 6 is a schematic diagram showing a more concrete example of the semiconductor manufacturing device 1 of FIG. 5.

FIG. 6 is a schematic diagram showing a more concrete example of the semiconductor manufacturing device 1 of FIG. 5. The semiconductor manufacturing device 1 of FIG. 6 has the carrier supply storage 22 and a third handler 23 in addition to the components of FIG. 2.

The carrier supply storage 22 stores a plurality of carriers 15, and sequentially selects one of them to supply it to the third handler 23. The third handler 23 corresponds to the third conveyor 21.

After the second handler 12 stores the shielded trays 17 on the carrier 15 in the tray supply storage 5, the third handler 23 conveys that carrier 15 to the carrier supply storage 22 to store it in the carrier supply storage 22, and takes out another carrier 15 from the carrier supply storage 22 to convey it to the first conveying table 19.

The third handler 23 may convey the carrier 15 using a slide in/out system, or using carrier conveying arms.

Figure 7:
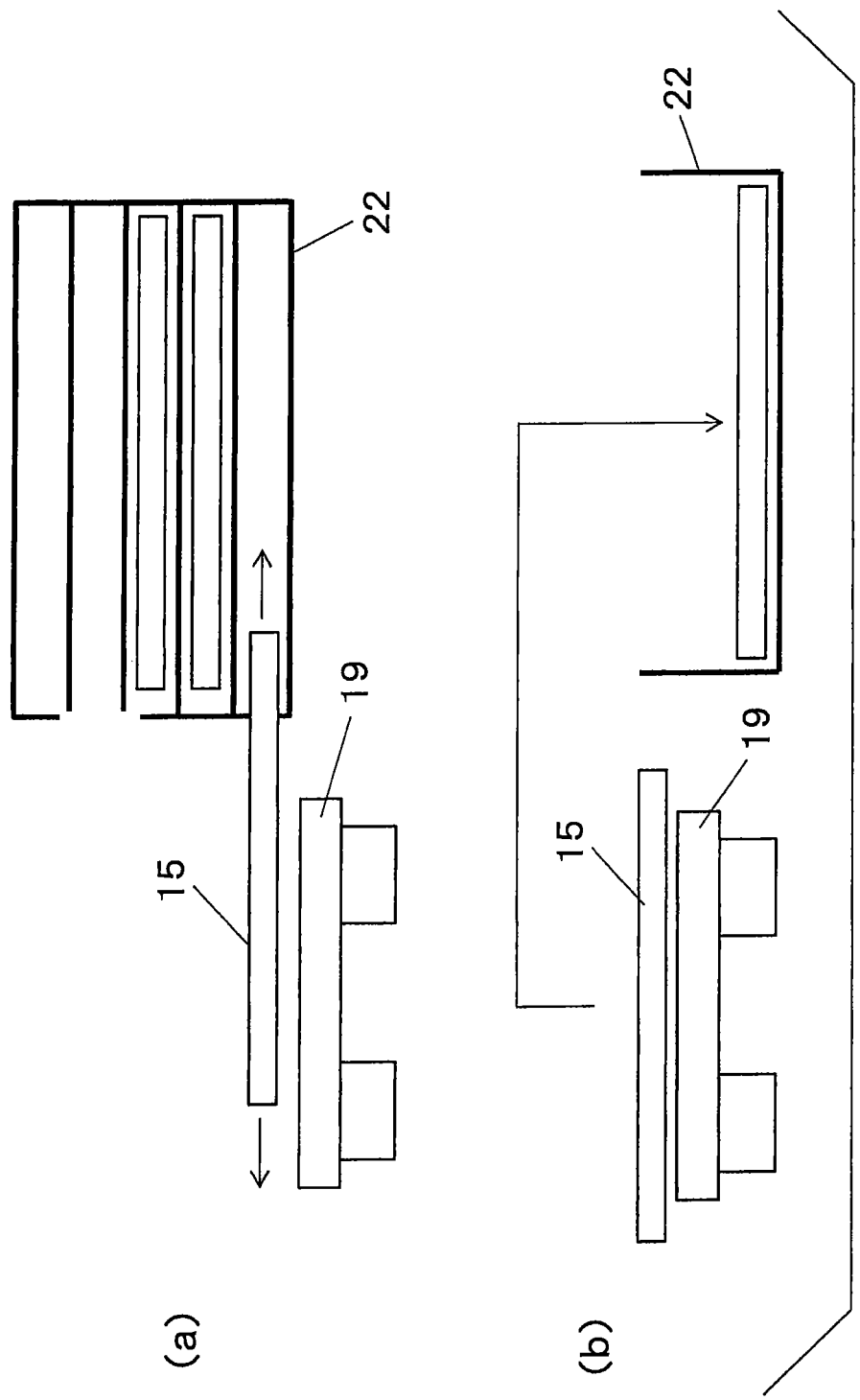
FIG. 7(a) is a diagram showing a first example of a carrier supply storage 22.
FIG. 7(b) is a diagram showing a second example of the carrier supply storage 22.

FIG. 7(a) is a diagram showing a first example of the carrier supply storage 22, and FIG. 7(b) is a diagram showing a second example of the carrier supply storage 22.

The carrier supply storage 22 of FIG. 7(a) is a cassette type, and the carrier 15 conveyed by the third conveyor 21 is stored in the uppermost cassette, for example. Further, the third conveyor 21 takes out and conveys the carrier 15 stored in the lowermost cassette, for example. When the third conveyor 21 takes out the carrier 15, the carrier 15 stored in each stage moves downward by one stage.

The carrier supply storage 22 of FIG. 7(b) sequentially superposes (i.e., stacks) and stores the carriers 15 conveyed by the third conveyor 21. Further, the third conveyor 21 sequentially selects and conveys one of the carriers 15 stacked in the carrier supply storage 22 in the order of from top to bottom.

A plurality of carrier supply storages 22 each having the structure of FIG. 7(a) or (b) may be provided. In this case, it is desirable that all of the carriers 15 in each carrier supply storage 22 can be taken out at one time. While cleaning all of the carriers 15 taken out from one carrier supply storage 22 at one time, another carrier supply storage 22 can be used to perform the sputtering treatment for electromagnetic shielding without stopping the semiconductor manufacturing device 1, which improves work efficiency.

As stated above, in the second embodiment, the carrier supply storage 22 storing a plurality of carriers 15 is provided. The carrier 15 after picking up the electromagnetically shielded trays 17 therefrom is temporarily stored in the carrier supply storage 22, and another carrier 15 is selected from the carrier supply storage 22 to newly perform the sputtering treatment. In this way, use frequency of each carrier 15 can be reduced while lengthening the interval for cleaning the carrier 15, which improves work efficiency.

Further, when a plurality of carrier supply storages 22 are provided and all of the carriers 15 in each carrier supply storage 22 can be taken out at one time, the carriers 15 taken out at one time can be cleaned together, which makes it possible to shorten the cleaning time. In addition, while one carrier supply storage 22 is being cleaned, another carrier supply storage 22 can be used to continue the sputtering treatment without stopping the semiconductor manufacturing device 1, which further improves work efficiency.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor manufacturing device comprising:
   a conveyor configured to convey a tray having an unshielded semiconductor device mounted thereon to go through electromagnetic shielding; and
   a controller configured to control the conveyor,
   wherein the controller performs control to take out the tray from a tray supply storage storing trays each having an unshielded semiconductor device mounted thereon to go through the electromagnetic shielding, place the tray on a carrier, and convey this carrier to a sputtering device which coats the unshielded semiconductor device with a sputtering material for the electromagnetic shielding, and the controller performs control to take out, from the sputtering device, the carrier having the tray placed thereon with an electromagnetically shielded semiconductor device being mounted on the tray, convey the tray, pick up the tray having the electromagnetically shielded semiconductor device mounted thereon from the carrier, and store the tray in the tray supply storage, and
   the conveyor circulates and uses an identical carrier.

2. The semiconductor manufacturing device of claim 1, wherein after picking up the tray from the carrier, the conveyor conveys this carrier to a carrier supply storage, stores this carrier in the carrier supply storage, and takes out, from the carrier supply storage, a carrier different from the carrier which has been stored in the carrier supply storage.

3. The semiconductor manufacturing device of claim 2, wherein the carrier supply storage is capable of storing a plurality of carriers, and
   the conveyor sequentially takes out the carriers stored in the carrier supply storage.

4. The semiconductor manufacturing device of claim 2, further comprising:
   a mechanism which takes out the carriers from the carrier supply storage at one time,
   wherein a plurality of carrier supply storages each capable of storing the carriers are provided.

5. The semiconductor manufacturing device of claim 4, wherein at least two carrier supply storages are provided, and
   while the carriers stored in one carrier supply storage are sequentially taken out and conveyed by the conveyor, the carriers stored in the other carrier supply storage can be taken out therefrom at one time.

6. The semiconductor manufacturing device of claim 1, wherein a plurality of the trays are placed on the carrier.

7. The semiconductor manufacturing device of claim 1, wherein a placement direction of the tray and the number of the trays to be placed on the carrier are set based on the size of the carrier and the size of the tray, so that the surface of the carrier having the tray placed thereon is exposed at a minimum level.

8. The semiconductor manufacturing device of claim 1, when the number of trays for storing an unshielded semiconductor device stored in the tray supply storage is smaller than the maximum number of trays to be placed on the carrier, the controller places a dummy tray having an identical size as the tray on the carrier to make up for the shortage.

9. The semiconductor manufacturing device of claim 1, further comprising:
   a first handler and a second handler controlled by the controller,
   wherein the second handler takes out a tray for storing an unshielded semiconductor device from the tray supply storage to place the tray for storing an unshielded semiconductor device on the carrier, and picks up the shielded tray from the carrier to store the picked-tray for storing an unshielded semiconductor device in the tray supply storage, and
   the first handler takes out a tray for storing an unshielded semiconductor device from the carrier to pass the tray for storing an unshielded semiconductor device to the sputtering device, and passes the carrier carried out from the sputtering device to the second handler.

10. A semiconductor manufacturing method comprising:
    taking out a tray from a tray supply storage storing trays each having an unshielded semiconductor device mounted thereon to go through electromagnetic shielding, to place the tray on a carrier;

conveying this carrier to a sputtering device which coats the unshielded semiconductor device with a sputtering material for the electromagnetic shielding, and taking out, from the sputtering device, the carrier having the tray placed thereon with an electromagnetically shielded semiconductor device being mounted on the tray, to convey the tray; and picking up the conveyed tray having the electromagnetically shielded semiconductor device mounted on from the carrier, to store the tray in the tray supply storage, wherein the conveyor circulates and uses an identical carrier.

11. The semiconductor manufacturing method of claim 10,
wherein after picking up the tray from the carrier, the conveyor conveys this carrier to a carrier supply storage, stores this carrier in the carrier supply storage, and takes out, from the carrier supply storage, a carrier different from the carrier which has been stored in the carrier supply storage.

12. The semiconductor manufacturing method of claim 11,
wherein the carrier supply storage is capable of storing a plurality of carriers, and
the conveyor sequentially takes out the carriers stored in the carrier supply storage.

13. The semiconductor manufacturing method of claim 11,
wherein a plurality of carrier supply storages each capable of storing the carriers are provided, and
each of the carrier supply storages has a mechanism which takes out the carriers at one time.

14. The semiconductor manufacturing method of claim 13,
wherein at least two carrier supply storages are provided, and
while the carriers stored in one carrier supply storage are sequentially taken out and conveyed by the conveyor, the carriers stored in the other carrier supply storage can be taken out therefrom at one time.

15. The semiconductor manufacturing method of claim 10,
wherein a plurality of the trays are placed on the carrier.

16. The semiconductor manufacturing method of claim 10,
wherein a placement direction of the tray and the number of the trays to be placed on the carrier are set based on the size of the carrier and the size of the tray, so that the surface of the carrier having the tray placed thereon is exposed at a minimum level.

17. The semiconductor manufacturing method of claim 10,
when the number of trays for storing an unshielded semiconductor device stored in the tray supply storage is smaller than the maximum number of trays to be placed on the carrier, a dummy tray having an identical size as the tray is placed on the carrier to make up for the shortage.

18. The semiconductor manufacturing method of claim 10, comprising:
controlling a first handler and a second handler,
wherein the second handler takes out a tray for storing unshielded semiconductor device from the tray supply storage to place the tray for storing an unshielded semiconductor device on the carrier, and picks up the shielded tray from the carrier to store the picked-up tray for storing an unshielded semiconductor device in the tray supply storage, and
wherein the first handler takes out an tray for storing an unshielded semiconductor device from the carrier to pass the tray for storing an unshielded semiconductor device to the sputtering device, and passes the carrier carried out from the sputtering device to the second handler.

* * * * *